US010023956B2

(12) United States Patent
Cui et al.

(10) Patent No.: US 10,023,956 B2
(45) Date of Patent: *Jul. 17, 2018

(54) ELIMINATING FIRST WAFER METAL CONTAMINATION EFFECT IN HIGH DENSITY PLASMA CHEMICAL VAPOR DEPOSITION SYSTEMS

(71) Applicant: Lam Research Corporation, Fremont, CA (US)

(72) Inventors: Lin Cui, Dublin, CA (US); Jason Daejin Park, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 14/683,022

(22) Filed: Apr. 9, 2015

(65) Prior Publication Data
US 2016/0300713 A1    Oct. 13, 2016

(51) Int. Cl.
| | |
|---|---|
| H01L 21/76 | (2006.01) |
| C23C 16/455 | (2006.01) |
| C23C 16/52 | (2006.01) |
| C23C 16/44 | (2006.01) |
| C23C 16/458 | (2006.01) |
| C23C 16/46 | (2006.01) |
| C23C 16/505 | (2006.01) |

(52) U.S. Cl.
CPC ........ *C23C 16/455* (2013.01); *C23C 16/4404* (2013.01); *C23C 16/4583* (2013.01); *C23C 16/466* (2013.01); *C23C 16/505* (2013.01); *C23C 16/52* (2013.01)

(58) Field of Classification Search
CPC .................... H01L 21/0228; H01L 21/02274
USPC ......................................................... 438/778
See application file for complete search history.

(56) References Cited

U.S. PATENT DOCUMENTS

| | | |
|---|---|---|
| 4,892,753 A | 1/1990 | Wang et al. |
| 5,605,859 A | 2/1997 | Lee |
| 5,647,953 A | 7/1997 | Williams et al. |
| 5,654,475 A | 8/1997 | Vassiliou et al. |
| 5,824,375 A | 10/1998 | Gupta |
| 5,970,383 A | 10/1999 | Lee |
| 6,071,573 A | 6/2000 | Koemtzopoulos et al. |
| 6,121,161 A | 9/2000 | Rossman et al. |
| 6,121,164 A | 9/2000 | Yieh et al. |

(Continued)

FOREIGN PATENT DOCUMENTS

CN    103243310 A    8/2013

OTHER PUBLICATIONS

U.S. Appl. No. 14/089,653, filed Nov. 25, 2013, entitled "Chamber Undercoat Preparation Method for Low Temperature ALD Films."

(Continued)

*Primary Examiner* — Mohammad Choudhry
(74) *Attorney, Agent, or Firm* — Weaver Austin Villenueve & Sampson LLP

(57) ABSTRACT

Methods and apparatuses for conditioning chambers using a two-stage process involving a low bias and a high bias stage are provided. Methods also involve clamping a protective electrostatic chuck cover to a pedestal by applying a bias to the electrostatic chuck during the high bias stage while cooling the protective electrostatic chuck cover, such as by flowing helium to the backside of the cover.

11 Claims, 4 Drawing Sheets

(56) References Cited

U.S. PATENT DOCUMENTS

| | | | |
|---|---|---|---|
| 6,416,577 | B1 | 7/2002 | Suntoloa et al. |
| 6,449,521 | B1 | 9/2002 | Gupta |
| 6,626,188 | B2 | 9/2003 | Fitzsimmons et al. |
| 6,749,098 | B2 | 6/2004 | Roier et al. |
| 6,815,007 | B1 | 11/2004 | Yoo et al. |
| 6,819,969 | B2 | 11/2004 | Lee et al. |
| 7,118,779 | B2 | 10/2006 | Verghese et al. |
| 7,204,913 | B1 | 4/2007 | Singh et al. |
| 7,232,492 | B2 | 6/2007 | Won et al. |
| 7,241,690 | B2 | 7/2007 | Pavone et al. |
| 7,288,284 | B2 | 10/2007 | Li et al. |
| 7,601,639 | B2 | 10/2009 | Pavone et al. |
| 7,704,894 | B1 | 4/2010 | Henri et al. |
| 7,767,584 | B1 | 8/2010 | Singh et al. |
| 7,799,135 | B2 | 9/2010 | Verghese et al. |
| 7,914,847 | B2 | 3/2011 | Verghese et al. |
| 7,923,376 | B1 | 4/2011 | Dhas et al. |
| 8,017,527 | B1 | 9/2011 | Dhas et al. |
| 8,101,531 | B1 | 1/2012 | Li et al. |
| 8,163,087 | B2 | 4/2012 | Faguet et al. |
| 8,293,658 | B2 | 10/2012 | Shero et al. |
| 9,228,259 | B2 | 1/2016 | Haukka et al. |
| 9,328,416 | B2 | 5/2016 | Dhas et al. |
| 2001/0006835 | A1 | 7/2001 | Kim et al. |
| 2002/0073922 | A1 | 6/2002 | Frankel et al. |
| 2003/0013314 | A1 | 1/2003 | Ying et al. |
| 2004/0023516 | A1 | 2/2004 | Londergan et al. |
| 2004/0134427 | A1 | 7/2004 | Derderian et al. |
| 2005/0130427 | A1 | 6/2005 | Won et al. |
| 2005/0214455 | A1 | 9/2005 | Li et al. |
| 2005/0221020 | A1 | 10/2005 | Fukiage |
| 2006/0046470 | A1 | 3/2006 | Becknell et al. |
| 2006/0093756 | A1 | 5/2006 | Rajagopalan et al. |
| 2006/0189171 | A1 | 8/2006 | Chua et al. |
| 2006/0280868 | A1 | 12/2006 | Kato et al. |
| 2007/0201016 | A1 | 8/2007 | Song et al. |
| 2008/0094775 | A1 | 4/2008 | Sneh et al. |
| 2008/0118663 | A1 | 5/2008 | Choi et al. |
| 2008/0286982 | A1* | 11/2008 | Li .................... H01J 37/32412 438/782 |
| 2008/0302281 | A1 | 12/2008 | Bernard et al. |
| 2009/0197401 | A1 | 8/2009 | Li et al. |
| 2009/0242511 | A1 | 10/2009 | Shimazu et al. |
| 2009/0278116 | A1 | 11/2009 | Yamate |
| 2009/0325391 | A1 | 12/2009 | De Vusser et al. |
| 2010/0048028 | A1* | 2/2010 | Rasheed ............. C23C 16/4404 438/758 |
| 2011/0070380 | A1 | 3/2011 | Shero et al. |
| 2011/0151142 | A1 | 6/2011 | Seamons et al. |
| 2011/0256726 | A1 | 10/2011 | LaVoie et al. |
| 2011/0315186 | A1 | 12/2011 | Gee et al. |
| 2012/0097330 | A1* | 4/2012 | Iyengar ............. C23C 16/45565 156/345.34 |
| 2013/0064973 | A1 | 3/2013 | Chen et al. |
| 2013/0089988 | A1 | 4/2013 | Wang et al. |
| 2014/0120738 | A1 | 5/2014 | Jung et al. |
| 2014/0295670 | A1 | 10/2014 | Shih et al. |
| 2015/0147482 | A1 | 5/2015 | Kang et al. |
| 2015/0203967 | A1 | 7/2015 | Dhas et al. |
| 2015/0221553 | A1* | 8/2015 | Ouye .................... H01L 21/683 438/462 |
| 2016/0281230 | A1 | 9/2016 | Varadarajan et al. |

OTHER PUBLICATIONS

U.S. Appl. No. 14/158,536, filed Jan. 17, 2014, entitled "Method and Apparatus for the Reduction of Defectivity in Vapor Deposited Films."

Kim et al. (1991) "Recombination of O, N, and H Atoms on Silica: Kinetics and Mechanism," Langmuir, 7(12):2999-3005.

Knoops et al.(2010) "Conformality of Plasma-Assisted ALD: Physical Processes and Modeling," Journal of the Electrochemical Society, 157(12):G241-G249.

U.S. Office Action dated Dec. 10, 2015 issued in U.S. Appl. No. 14/089,653.

U.S. Office Action dated May 13, 2016 issued in U.S. Appl. No. 14/089,653.

U.S. Final Office Action dated Oct. 28, 2016 issued in U.S. Appl. No. 14/089,653.

US Office Action, dated Aug. 17, 2015, issued in Application No. 14/158,536.

U.S. Notice of Allowance, dated Jan. 11, 2016, issued in U.S. Appl. No. 14/158,536.

U.S. Office Action, dated Nov. 18, 2016, issued in U.S. Appl. No. 14/712,167.

Chinese First Office Action, dated Sep. 5, 2016, issued in Application No. CN 201410686823.4.

Cunge et al. (2005) "New chamber walls conditioning and cleaning strategies to improve the stability of plasma processes," *Plasma Sources Sci. Technol.* 14:509-609.

Cunge et al. (2005) "Plasma-wall interactions during silicon etching processes in high-density HBr/Cl$_2$/O$_2$ plasmas," *Plasma Sources Sci. Technol.* 14:S42-S52.

Juárez et al. (2009) "Low temperature deposition: properties of SiO$_2$ films from TEOS and ozone by APCVD system," XIX Latin American Symposium on Solid State Physics (SLAFES XIX). *Journal of Physics: Conference Series* 167(012020) pp. 1-6.

Kang et al. (Jul./Aug. 2005) "Evaluation of silicon oxide cleaning using F$_2$/Ar remote plasma processing," *J. Vac. Sci. Technol.* A 23(4):911-916.

Kim et al. (2015) "Investigation of Plasma Enhanced Chemical Vapor Deposition Chamber Mismatching by Photoluminescence and Raman Spectroscopy," *ECS Journal of Solid State Science and Technology*, 4(8)P314-P318.

Klimecky et al. (May/Jun. 2003) "Compensation for transient chamber wall condition using real-time plasma density feedback control in an inductively coupled plasma etcher," *Journal Vac. Sci. Technol. A*, 21(3):706-717.

Nakagawa, Takahide (May 1991) "Effect of Coating on the Plasma Chamber Wall in RIKEN Electron Cyclotron Resonance Ion Source," *Japanese Journal of Applied Physics*, 30(5B)L930-L932.

U.S. Notice of Allowance dated Jan. 23, 2017 issued in U.S. Appl. No. 14/089,653.

U.S. Final Office Action, dated Apr. 20, 2017, issued in U.S. Appl. No. 14/712,167.

U.S. Notice of Allowance dated Jun. 1, 2017 issued in U.S. Appl. No. 14/089,653.

Chinese Second Office Action, dated May 8, 2017 issued in Application No. CN 2014/10686823.4.

U.S. Appl. No. 15/384,175, filed Dec. 19, 2016, Wang et al.

* cited by examiner ically contaminating materials. Over time, metal particles from the chamber walls and components may be deposited onto wafers during processing. For example, a first wafer to be processed in a chamber may experience a "first wafer metal contamination effect," where contamination from chamber walls and components are deposited onto the first wafer of a batch of wafers to be processed.

ELIMINATING FIRST WAFER METAL CONTAMINATION EFFECT IN HIGH DENSITY PLASMA CHEMICAL VAPOR DEPOSITION SYSTEMS

BACKGROUND

Systems for depositing films using plasma-based chemistries are used for various applications such as to fabricate integrated circuits. As the semiconductor and other industries advance, device dimensions are becoming increasingly smaller. These progressively smaller features require deposition procedures that are highly uniform, and the presence of film impurities or other non-uniformities can often lead to the failure of a device. Various techniques may be performed prior to wafer processing to reduce defects and contamination during wafer processing. However, metal particles are still incorporated into wafers despite these conventional techniques.

SUMMARY

Provided herein are methods and apparatuses for eliminating contamination on the first wafer of a batch of wafers to be processed. One aspect involves a method including: (a) performing a first stage including exposing a chamber to plasma to deposit a film on surfaces of the chamber while no wafer is present in the chamber at a first bias power, the bias power applied to an electrostatic chuck in the chamber; and (b) after performing the first stage, performing a second stage including exposing the chamber to plasma to deposit a second film on surfaces of the chamber while no wafer is present in the chamber at a second bias power, where the second bias power is greater than the first bias power.

In some embodiments, (b) further includes clamping a protective cover to the electrostatic chuck and flowing a gas to the backside of the protective cover. The pressure of the gas flowed to the backside of the protective cover may be less than about 3 Torr. In some embodiments, the protective cover includes ceramic material. The protective cover may be clamped for at least about 10 seconds. The protective cover may be clamped at a clamping voltage of at least about 2000V.

In various embodiments, (b) further includes cooling a protective cover on the electrostatic chuck. In some embodiments, (b) further includes performing high density plasma chemical vapor deposition.

The first bias power may be less than about 1500 W. The second bias power may be at least about 2000 W.

In some embodiments, the method further includes (c) after performing the second stage, exposing a wafer to plasma in the chamber to deposit a film by high density plasma chemical vapor deposition.

Another aspect involves a method including exposing a plasma chamber including a protective cover on a chuck to a plasma to thereby coat surfaces of the chamber with a film, where the protective cover is actively cooled during the plasma exposure.

The protective cover may be actively cooled by clamping the protective cover to the chuck and flowing a gas to the backside of the protective cover. The pressure of the gas flowed to the backside of the protective cover may be less than about 3 Torr. The protective cover may be clamped at a clamping voltage of at least about 2000V. The protective cover may be clamped for at least about 10 seconds.

In some embodiments, the protective cover includes ceramic material. In various embodiments, the method further includes applying a bias to the chuck during the plasma exposure.

Another aspect involves an apparatus for processing wafers, the apparatus including: (a) a plasma generator; (b) a chamber including a pedestal with an electrostatic chuck; (c) a heat transfer subsystem including a gas line configured to supply gas to the pedestal; (d) one or more gas inlets; and (e) a controller including machine-readable instructions for: (i) generating a plasma in the chamber at a first bias power for a duration sufficient to coat the interior surfaces of the chamber, (ii) after (i), generating a second plasma in the chamber at a second bias power to deposit a film on the interior surfaces of the chamber at a second bias power, where the second bias power is greater than the first bias power. The controller may further include machine-readable instructions for flowing helium via the gas line to supply helium to the pedestal during (ii).

These and other aspects are described further below with reference to the drawings.

DETAILED DESCRIPTION

Figure 1:
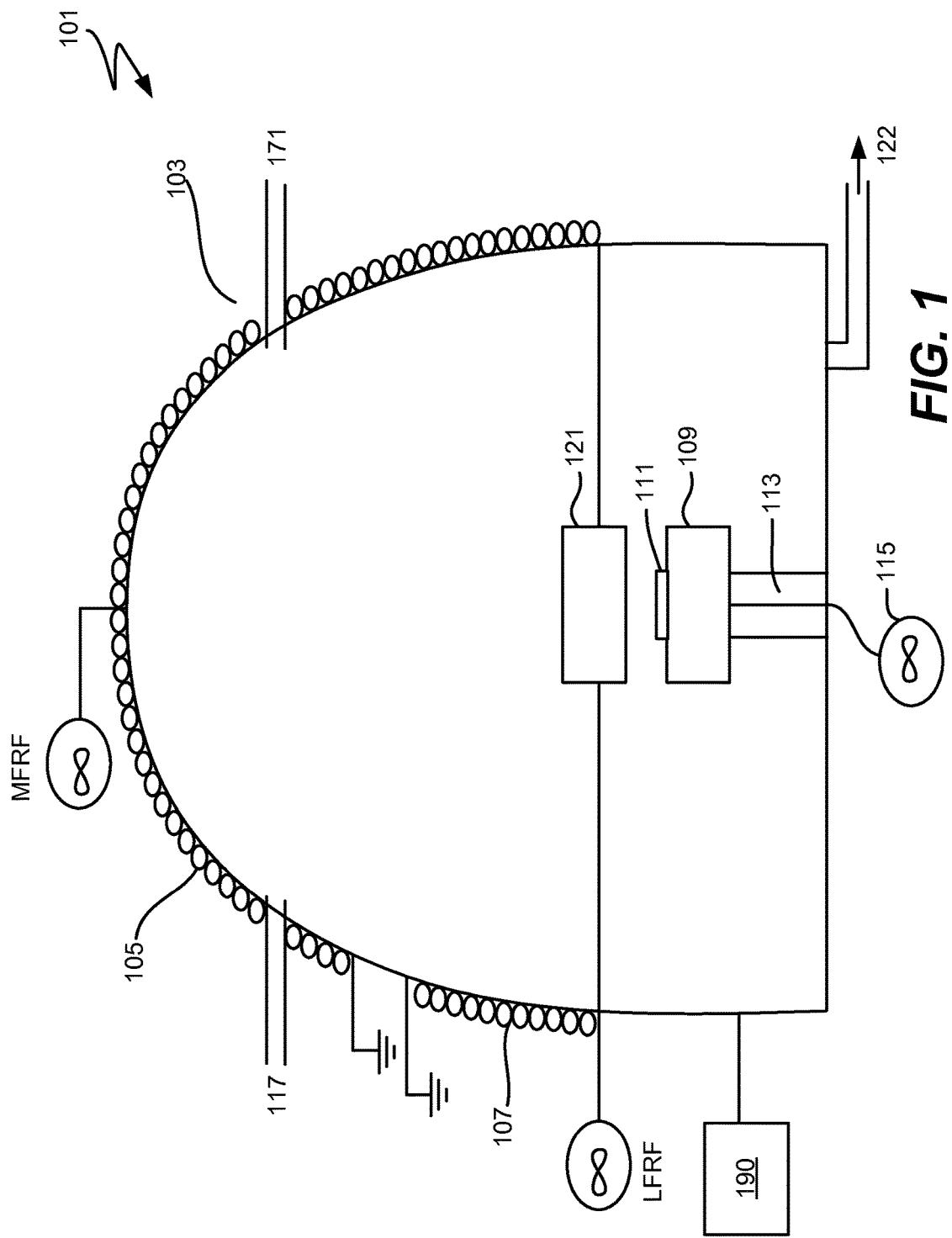
FIG. 1 is a schematic illustration of an example of a reactor suitable for performing disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "wafer" and "substrate" are used interchangeably. One of ordinary skill in the art would understand in many embodiments the methods and apparatus described herein can be used prior to or during processing of a silicon wafer during any of many stages of integrated circuit fabrication thereon. A wafer or substrate used in the semiconductor device industry typically has a diameter of 200 mm, 300 mm, or 450 mm. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels. Accordingly, where the term "wafer" is used in the description below, it will be understood that the description also applies to a panel or other substrate.

As semiconductor device dimensions shrink, methods of fabricating semiconductor devices become increasingly sensitive to contamination. For example, semiconductor devices are often fabricated in reactors or chambers including chamber components and chamber walls made of metallic material, such as aluminum. While some semiconductor device fabrication processes do not involve plasma, in some processes that do implement a plasma, chamber components exposed to an in-situ plasma during deposition may flake and peel, thereby increasing the risk of incorporating metallic particles into the films deposited on a wafer. For example, "high density plasma chemical vapor deposition" (HDP CVD) systems generate high density plasma used for integrated circuit applications, such as dielectric film deposition and gap filling. Some systems implement inductively-coupled plasma powered by low frequency radio frequency (LFRF) power on a top dome and capacitively-coupled plasma powered by high frequency (HF) power at an electrostatic chuck (ESC). Gases are flowed ionized and accelerated towards a wafer on the ESC during processing. HDP CVD processing may implement simultaneous sputtering etch during deposition to allow gap filling of high aspect ratio trenches. Components of an HDP CVD system may be susceptible to flaking and peeling when exposed to plasma used during processing.

Note that while methods and apparatuses described herein refer to HDP CVD reactors, it will be understood that certain disclosed embodiments may also be used with other plasma reactors. For example, disclosed embodiments may be used with "plasma-enhanced chemical vapor deposition" (PECVD) reactors such as the Vector tool available from Lam Research Corporation of Fremont, Calif., or plasma etch reactors such as the Kiyo tool available from Lam Research Corporation of Fremont, Calif. HDP CVD as used herein is distinct from PECVD. HDP CVD process conditions and resulting films are different from capacitively-coupled PECVD processes. For example, various HDP reactors as described herein operate at a pressure less than about 100 mTorr, with a plasma density greater than $10^{11}$ ions/$cm^3$. HDP reactors may ignite plasma at a plasma frequency of 400 kHz for coils and a frequency of 13.56 MHz for the pedestal where the wafer is placed. In a capacitively-coupled plasma reactor, a plasma frequency of 13.56 MHz is used to generate plasma as applied to either a showerhead or the pedestal, and 400 kHz is applied to either the showerhead or the pedestal. Ion energies in HDP reactors may be greater than in PECVD reactors. As a result, film composition and characteristics of films deposited in HDP CVD reactors are different than those deposited in PECVD reactors.

Some conventional methods have been used to reduce contamination on wafers deposited in plasma reactors such as HDP CVD reactors and PECVD reactors. For example, pre-processing methods include conditioning a chamber with a pre-coat or conditioning layer prior to processing wafers. A conditioning layer is defined as a layer of film typically formed on the interior surfaces of the reaction chamber while no wafer is present in the reaction chamber. Conditioning may include depositing one or more conditioning layers (e.g., an undercoat and/or a pre-deposition coat) on the surfaces of the reaction chamber. Examples of surfaces that become coated include the chamber walls/ceiling/floor, pedestal, wafer carrier ring, showerhead, exhaust system, fluid line, pump, spindle, wafer transfer arm, filler plates, secondary purge collars, etc.

Films deposited in reaction chambers lacking a conditioning layer often have substantial metal contamination problems. When an uncoated metal chamber is exposed to plasma, small amounts of metal may be removed from the chamber surfaces and end up on the film deposited on a wafer. These metal impurities can negatively affect the performance of the devices formed on the wafer, and in some cases can lead to device failure. The conditioning layer is deposited to protect the chamber components from flaking during exposure to plasma. With regard to balancing impedance, the chamber conditioning layer is especially useful when depositing CVD-based films, which are deposited by gas phase reactions. Because the reaction chamber is made of metal and the film deposited on wafers is often a dielectric material, the impedance of the reaction chamber changes as the dielectric is deposited. Thus, by providing a conditioning layer, the impedance of the chamber can become relatively stabilized before any wafers are processed, thereby maximizing processing uniformity.

However, conventional conditioning techniques may still result in metal contamination, particularly on the first wafer processed after the conditioning is performed. This effect may be due to the difference in chamber conditions during the conditioning versus during the deposition. Film properties from the conditioning and the deposition vary due to different bias powers used during each process. Some conditioning processes are performed at different conditions than during deposition due to other components that may be present in the chamber during conditioning. For example, a plasma reactor may include a pedestal upon which a wafer is placed for processing during deposition. The pedestal may include an ESC. During the conditioning process, the ESC is protected to prevent damage to the surface such as by placing a protective electrostatic chuck cover (PEC) on the ESC to protect it from plasma exposure. However, the PEC may be susceptible to breakage when exposed to plasma generated with a high power. Thus, conventional conditioning is performed using a high frequency radio frequency (HF RF) plasma at low power to minimize damage to the PEC, but the power is low to prevent the PEC from becoming too hot and breaking. However, films may be deposited at higher power after conditioning, and such films have poor adhesion on the conditioning layer, thereby causing the conditioning layer to flake off of chamber components, and leaving chamber components exposed to the plasma and contributing to metal contamination on subsequent wafers.

As a result, conventional methods have also involved using a dummy wafer between the conditioning process and the deposition process such that any metal contamination occurs on the dummy wafer, rather than the first wafer to be processed. In one example, a dummy wafer may be placed in a storage cassette such as a Front Opening Unified Pod (FOUP) located at the frontend podloader of a tool used to process wafers. An automatically programmed robot system may map and transfer wafers through a loadlock and a wafer transfer system (WTS) into a HDP CVD process chamber. A dummy FOUP containing one bare silicon wafer may also be added to the frontend to house a dummy wafer. The dummy wafer may be transferred into process chamber immediately after the conditioning process is performed. The deposition process is then performed on the dummy wafer, and device wafers from the main FOUP are then subsequently processed in sequence. The dummy wafer can be deposited for multiple times and recycled. However, such methods waste dummy wafers and reduce throughput in wafer processing. Moreover, implementing a process involving a dummy wafer uses extra hardware components such as additional podloaders and software used to enable automatic mapping, transfer, and processing of the additional dummy FOUP. The dummy wafer cannot be used for a device, which raises the silicon material cost of overall processing.

Alternative conventional techniques for reducing contamination also involve depositing more material during the conditioning process and introducing a high pressure transfer plasma. However, these methods reduce throughput and consume more precursor gas, and may still cause contamination due to flaking or transfer plasma non-optimization.

Provided herein are methods for reducing or eliminating first wafer metal contamination by performing a two-stage conditioning process. In some embodiments, the disclosed embodiments include applying a higher bias power during the second stage than during the first stage. The chamber may be exposed to the same or different gases in each stage.

In some embodiments, the method involves placing a PEC on the ESC in a chamber and exposing the PEC to the same deposition conditions as for the wafers during the second stage. For example, after the conditioning layer is deposited in the chamber, the PEC may remain on the ESC while precursor gases to be used for wafers are introduced into the chamber and deposited on the PEC at deposition conditions. Subsequently, the first wafer may then be transferred to the chamber to be processed at the same conditions. Methods described herein may involve minimal changes in a process flow and reduce costs by eliminating the use of a dummy wafer while maintaining throughput.

Methods described herein are performed in an apparatus for processing wafers. Such an apparatus may take many different forms. Generally, the apparatus will include one or more chambers or reactors (sometimes including multiple stations) that house one or more wafers and are suitable for wafer processing. The one or more chambers maintain the wafer in a defined position or positions (with or without motion within that position, e.g. rotation, vibration, or other agitation). While in process, each wafer is held in place by a pedestal, which may include an ESC. For certain operations in which the wafer is to be heated, the apparatus may include a heater such as a heating plate. An example of a suitable reactor is the SPEED™ reactor, available from Lam Research Corporation of Fremont, Calif.

FIG. 1 is a schematic illustration of an example of a HDP CVD reactor suitable for performing disclosed embodiments. Reactor 101 includes a process chamber 103, which encloses other components of the reactor and serves to contain the plasma. In some implementations, the process chamber walls are made from aluminum, aluminum oxide, and/or other suitable material. The embodiment shown in FIG. 1 has two plasma sources: top RF coil 105 and side RF coil 107. Top RF coil 105 is a medium frequency or MFRF coil and side RF coil 107 is a low frequency or LFRF coil. In the embodiment shown in FIG. 1, MFRF frequency may be from 430-470 kHz and LFRF frequency from 340-370 kHz. However, disclosed embodiments are not limited to operation in reaction chambers with dual sources, nor RF plasma sources. Any suitable plasma source or sources may be used.

Within the reactor, a wafer pedestal 109 supports a workpiece 111. The workpiece 111 may be a PEC or a wafer. The wafer pedestal 109 includes a chuck (sometimes referred to as a clamp) to hold (or clamp) the wafer in place. The chuck may be used to clamp an object on the pedestal during various processes. The chuck may be an ESC, a mechanical chuck, or various other types of chuck as are available for use. A gas delivery subsystem including a line 113 for supplying gas or heat transfer liquid to the wafer pedestal 109 controls the temperature of workpiece 111. The wafer pedestal 109 and gas delivery subsystem can facilitate maintaining appropriate wafer temperatures.

A high frequency RF of HFRF source 115 serves to electrically bias the workpiece 111 and draw charged gas species onto the workpiece 111 during various processes. Electrical energy from source 115 is coupled to the workpiece 111 via an electrode or capacitive coupling, for example. Note that the bias applied to the workpiece 111 may not be an RF bias. Other frequencies and DC bias may be used as well.

The process gases are introduced via one or more inlets 117. The gases may be premixed or not. The process gases may be introduced through a gas supply inlet mechanism including orifices. In some embodiments, at least some of the orifices orient the process gas along an axis of injection intersecting an exposed surface of the workpiece 111 at an acute angle. Further, the process gases may be introduced from a primary gas ring 121, which may or may not direct the gases toward the pedestal. In some embodiments, process gases may be introduced from one or more gas rings (not shown) in addition to primary gas ring 121. Injectors may be connected to the primary gas ring 121 to direct at least some of the gases or gas mixtures into the chamber and toward the pedestal. Note that injectors, gas rings or other mechanisms for directing process gas toward the wafer may not be used in some embodiments. The sonic front caused by a process gas entering the chamber will itself cause the gas to rapidly disperse in all directions—including toward the workpiece 111. Process gases exit chamber 103 via an outlet 122. A vacuum pump (e.g., a turbomolecular pump) typically draws process gases out and maintains a suitably low pressure within the reactor. Reactor 101 may be controlled using controller 190. Controller 190 may include machine-readable instructions for performing various operations disclosed herein. Further description regarding the controller 190 is provided below.

Figure 2:
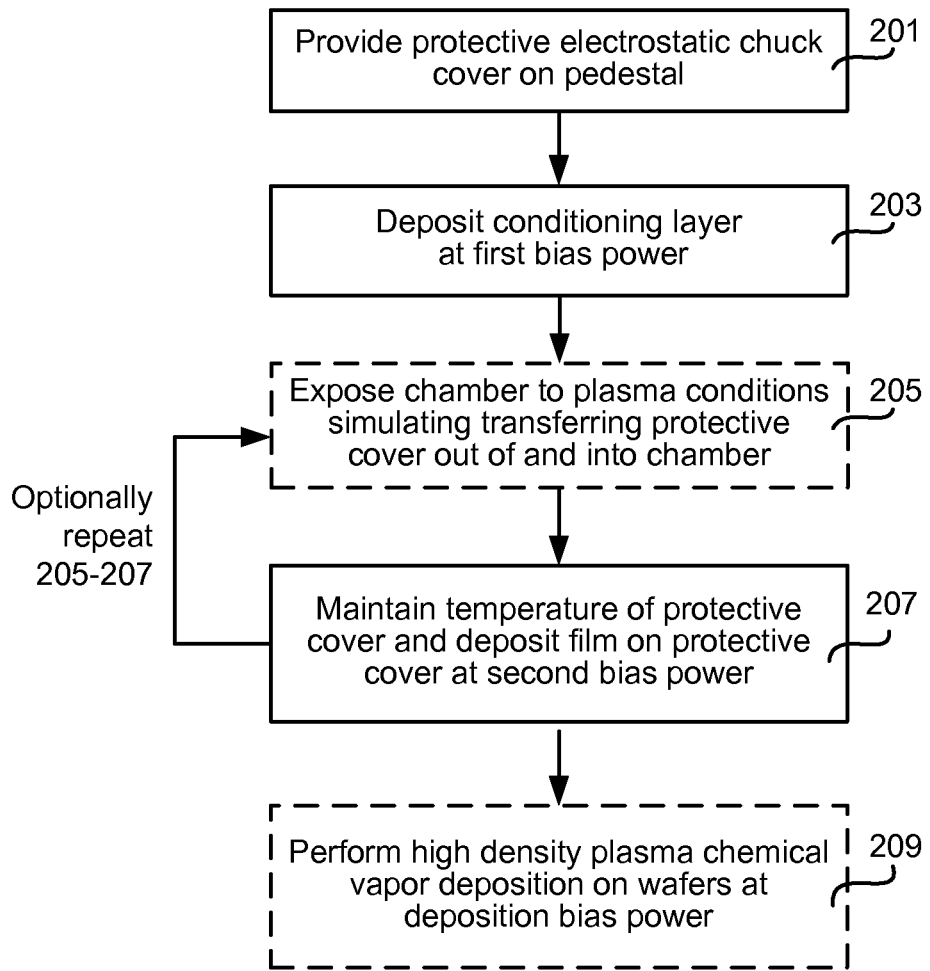
FIG. 2 is a process flow diagram depicting operations performed in accordance with disclosed embodiments.

FIG. 2 provides a process flow diagram depicting operations for performing a method in accordance with disclosed embodiments. In operation 201, a PEC is provided on an ESC of a pedestal in a process chamber such as the one described above with respect to FIG. 1. In various embodiments, the PEC is placed on the pedestal, but not clamped to the pedestal during operation 201.

A PEC suitable for use in various embodiments has various characteristics. In various embodiments, the size and material of the PEC is selected to allow the PEC to be clamped to the pedestal and to withstand processing as described herein. In some embodiments, the PEC may be a size similar to that of wafers to be processed. For example, a PEC may be about 250 mm in diameter, or 300 mm in diameter, or 450 mm in diameter. In various embodiments, the PEC is 300 mm in diameter. The PEC may be made of ceramic material, such as aluminum nitride.

In operation 203, a conditioning layer is deposited on surfaces of the chamber during a first stage. The conditioning layer may also be deposited on the PEC. During operation 203, one or more gases is introduced to the chamber while a first bias power is applied. The first bias power is selected depending on the material of the PEC to mitigate breakage of the PEC. For example, in some embodiments, the PEC may have a threshold bias power that may be applied beyond which a high bias power would increase the PEC's thermal non-uniformity and result in PEC breakage. In various embodiments, the maximum first bias power may be between about 1500 W and 3000 W. In some embodiments, the maximum first bias power is about 1500 W. Any suitable conditioning layer gas may be used. Examples include silane, oxygen, helium, and combinations thereof. During operation 203, the conditioning layer may be deposited to a thickness between about 2 and about 3 µm. Operation 203 may be performed for a duration between about 5 and about 7 minutes. (These ranges are given as examples of ranges with other thicknesses and durations appropriate depending on the particular apparatus and process employed.)

In operation 205, the chamber is exposed to plasma conditions simulating the process for transferring a workpiece out of and a wafer into the chamber. Note however, the PEC may not be transferred out of the chamber during this operation and may remain within the chamber. In various embodiments, operation 205 includes exposing the PEC to oxygen and a helium plasma using a LFRF plasma. In some embodiments, operation 205 may be performed for a duration between about 10 seconds and about 40 seconds, for example, about 20 seconds.

In operation 207, a film may be deposited on chamber components at a second bias power in a second stage. In various embodiments, the second bias power in operation 207 is greater than the first bias power in operation 203. For example, the bias may be applied at a power between about 2000 W and about 9500 W. However, since the bias applied is at a bias power that may be greater than the threshold power of PEC before a PEC may break, the PEC may break after many deposition processes due to high thermal non-uniformity under HFRF plasma heating, which affects the PEC's thermal properties (thermal conductivity, specific heat, and expansion coefficient), mechanical properties (density, Young's modulus, and Poisson's ratio), thickness and surface roughness.

As a result, during operation 207, the temperature of the PEC is maintained by cooling the PEC. For example, the PEC may be cooled by flowing a gas such as helium to the backside of the PEC via channels on the ESC. In various embodiments, the PEC is cooled to reduce its thermal non-uniformity during processing and prevent breakage, since the PEC is made of material that may not be able to withstand a higher second bias power used during this operation.

The PEC remains on the pedestal during operation 207 to prevent damage to the ESC. To prevent the PEC from being displaced while a gas is flowed to the backside, the PEC is clamped to the pedestal using a clamping mechanism, such by electrostatically clamping or mechanically clamping the PEC. In various embodiments, the PEC is electrostatically clamped. The voltage of the ESC used to clamp the PEC to the pedestal depends on the type of ESC used. For example, in some embodiments, the clamping voltage may be at least about 2000V. In some embodiments, a mechanical clamping mechanism may be used while preventing any disturbance of the HFRF electric field and film growth on the PEC surface.

Any suitable gas may be used to deposit the film in operation 209. In some embodiments, one or more gases used in operation 209 is also used in operation 203. In various embodiments, operation 209 may include pre-heating the PEC, diverting a gas, depositing a film, etching the film to passivate the surface, and post-cooling.

In various embodiments, operations 205 and 207 may be repeated one or more times to reduce metal contamination. For example, after operation 207, chamber is exposed to plasma conditions simulating the process for transferring a wafer out of the chamber and back into the chamber to again simulate the transferring in of another wafer. Operation 207 may then be performed again to simulate a deposition process for a wafer while clamping the PEC and introducing a gas to the backside of the PEC to maintain the temperature of the PEC. These operations may be repeated to further reduce metal contamination in wafers processed after operation 207.

In some embodiments, after operation 207, the PEC is removed, and the first wafer is transferred to the chamber and placed on the pedestal for processing. In some implementations, the PEC is declamped and the backside gas flow used to cool the PEC is turned off, and the pedestal is moved to a position suitable for wafer processing.

In some embodiments, operation 209 is performed after operations 201-207. In operation 209, the wafers are optionally processed by depositing a film on wafers at a deposition bias power. In some embodiments, the film is deposited by HDP CVD. In various embodiments, the deposition bias power is approximately the same as or is the same as the second bias power used in operation 207. The deposition bias power may be greater than the first bias power in operation 203. For example, the deposition bias power may be between about 2000 W and about 9500 W, for example about 2000 W. One or more gases used during operation 209 may be the same as one or more gases used to deposit the film in operation 207. In some embodiments, one or more gases used during operation 209 may be the same as one or more gases used in operation 203 to deposit the conditioning layer. In some embodiments, the process conditions for operation 207 are also used in operation 209, such as chamber pressure, pedestal temperature, bias power, gas chemistry and flow rates, etc. Wafers processed using disclosed embodiments exhibit lower metal contamination, and the PEC may be cleaned and reused for more than one batch of wafers to be processed.

Apparatus

Disclosed embodiments may be performed in a chamber such as the chamber shown in FIG. 1 as described above. Although a high density plasma chemical vapor deposition (HDP CVD) chamber is depicted in FIG. 1, other reactors or tools for depositing films may be used in various embodiments described herein.

As previously described, reactor 101 includes a controller 190 for controlling operations in accordance with disclosed embodiments. The controller 190 may be used to control various parameters, such as flow rate and pressure for gas flow to the pedestal 109 via inlet 113, movement of the pedestal 109, bias power for an electrostatic chuck (ESC), plasma power for the MFRF coils 105 and LFRF coils 107, pedestal temperature, chamber pressure, gas flow to the process chamber 103, transfer of the workpiece 111 in and out of the chamber 103, and other operations.

Figure 3:
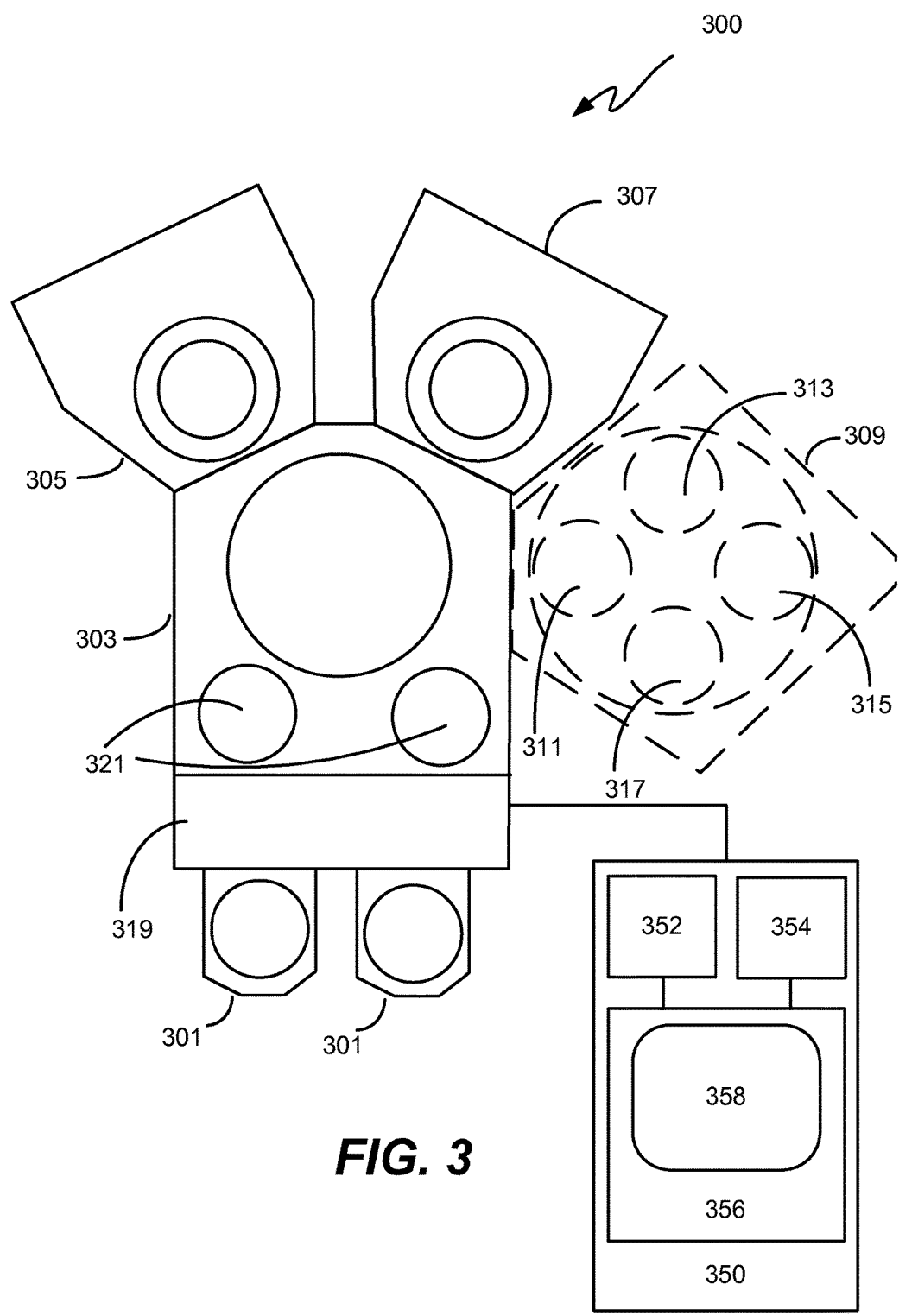
FIG. 3 is a schematic illustration of an example of a tool suitable for performing disclosed embodiments.

In some embodiments, a reactor 101 shown in FIG. 1 is part of a tool for processing one or more wafers. An example of a tool including one or more reactors is provided in FIG. 3. FIG. 3 is a block diagram of a plasma processing system suitable for conducting a multi-step deposition process in accordance with disclosed embodiments. The system 300 includes a transfer module 303, such as the wafer transfer system (WTS) used on the SPEED™ platform available from Lam Research Corporation of Fremont, Calif. The transfer module 303 provides a clean, pressurized environment to minimize the risk of contamination of workpieces, such as wafers, being processed as they are moved between the various processing stages. Mounted on the transfer module 303 are one or more HDP CVD modules or process chambers 305, such as Lam SPEED™ reactors, available from Lam Research Corporation of Fremont, Calif. The etch modules 307 may be a Lam atomic layer removal (ALR) reactor or Kiyo™ reactor. These etch reactors may be mounted on the same or separate platforms as the deposition reactors.

The system may optionally include a chamber 309 capable of performing PECVD or atomic layer deposition (ALD) process. Chamber 309 may include multiple stations 311, 313, 315, and 317 that may sequentially perform deposition or removal operations or protective electrostatic chuck cover (PEC) cleaning operations. The system 300 also includes one or more (in this case two) wafer source modules 301 where wafers are stored before and after processing. A device (generally a robot arm unit) in the transfer module 303 moves the wafers among the modules mounted on the transfer module 303.

Wafers are transferred by the robot arm between the HDP CVD reactors 305 and/or the plasma etch reactor 307 for deposition and etch back processing, respectively. The robot arm may also transfer wafers between the conditioning layer deposition module 309 and the other chambers. In one embodiment, a single etch reactor can support two SPEED deposition modules 305 in this application with a high throughput of about 15-16 wafers per hour (wph). In other embodiments, two etch reactors 307 may support one or more SPEED deposition modules 305.

Disclosed embodiments may also be practiced without a plasma etch chamber. For example, a single chamber may be configured for both HDP CVD deposition and reactive plasma etch. For example, the Lam SPEED HDP-CVD reactors are capable of conditioning, deposition, and plasma etch with a throughput similar to that of using separate reactors. Given the details and parameters provided herein, a single chamber may be configured, for example, a plasma reactor, with equipment, for example the various plasma sources described herein, for deposition (HDP CVD) and reactive plasma etch (e.g., in-situ or downstream plasma source).

FIG. 3 also depicts an embodiment of a system controller 350 employed to control process conditions and hardware states of process tool 300. System controller 350 may provide program instructions for implementing the above-described processes. The program instructions may control a variety of process parameters, such as DC power level, RF bias power level, pressure, temperature, etc. The instructions may control the parameters to condition a chamber and perform deposition operations on a PEC prior to processing wafers in a batch according to various embodiments described herein.

In some implementations, a controller 350 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 350, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 350 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

In some embodiments, system controller 350 controls all of the activities of process tool 300. System controller 350 may include one or more memory devices 356, one or more mass storage devices 354, and one or more processors 352. Processor 352 may include a CPU or computer, analog and/or digital input/output connections, stepper motor controller boards, etc. System controller 350 executes system control software 358 stored in mass storage device 354, loaded into memory device 356, and executed on processor 352. Alternatively, the control logic may be hard coded in the controller 350. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 358 may include instructions for controlling the transfer of PEC into and out of a process chamber, transfer of wafers into and out of a process chamber, timing of gases, mixture of gases, amount of gas flow, chamber and/or station pressure, backside gas flow pressure, chamber and/or reactor temperature, wafer temperature, bias power, target power levels, RF power levels, pedestal, chuck and/or susceptor position, and other parameters of a particular process performed by process tool 300. System control software 358 may be configured in any suitable way. For example, various process tool component subroutines or control objects may be written to control operation of the process tool components necessary to carry out various process tool processes. System control software 358 may be coded in any suitable computer readable programming language.

The controller 350, in some implementations, may be a part of or coupled to a computer that is integrated with, coupled to the system, otherwise networked to the system, or a combination thereof. For example, the controller 350 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 350 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 350 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, system control software 358 may include input/output control (IOC) sequencing instructions for controlling the various parameters described above. Other computer software and/or programs stored on mass storage device 354 and/or memory device 356 associated with system controller 350 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load a wafer or PEC onto a pedestal and to control the spacing between the wafer or PEC and other parts of process tool 300. A process gas control program may include code for controlling gas composition (e.g., conditioning process gases, deposition gases, helium gas or other gas for backside flow, carrier gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, pressure of gas introduced to backside of PEC during conditioning operations, etc.

A heater control program may include code for controlling the current to a heating unit that is used to heat the workpiece. Alternatively, the heater control program may control delivery of a heat transfer gas (such as helium) to the wafer. A plasma control program may include code for setting RF power levels applied to the process electrodes and the bias in one or more process stations in accordance with the embodiments herein. A pressure control program may include code for maintaining the pressure in the reaction chamber in accordance with the embodiments herein.

In some embodiments, there may be a user interface associated with system controller 350. The user interface may include a display screen, graphical software displays of the apparatus and/or process conditions, and user input devices such as pointing devices, keyboards, touch screens, microphones, etc.

In some embodiments, parameters adjusted by system controller 350 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 350 from various process tool sensors. The signals for controlling the process may be output on the analog and digital output connections of process tool 300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EXPERIMENTAL

Experiment 1

An experiment was conducted comparing metal contamination in the first few wafers for wafers processed using various methods. The first method represented standard wafer processing, which involved exposing the chamber to a conditioning process for pre-coating the chamber while a protective electrostatic chuck cover (PEC) was placed on the electrostatic chuck (ESC) to prevent exposure of the ESC to the conditioning chemistry. After the chamber was pre-coated, the PEC was transferred out of the chamber, and the first wafer was introduced to the chamber and the first deposition process was performed on the first wafer. The rest of a batch of wafers was also subsequently processed.

The second method involved using disclosed embodiments using a PEC that was not previously exposed to numerous deposition operations. In this method, the PEC was placed on the ESC while the chamber was exposed to conditioning chemistry to pre-coat the chamber with a conditioning layer. The PEC was transferred out of the chamber and back into the chamber to simulate the transferring in of a wafer. The first deposition process was performed on the PEC, while the PEC was electrostatically clamped to the pedestal and helium was flowed as a backside gas to the PEC to maintain its temperature. The deposition process was performed to maintain the PEC at a temperature less than 410° C., with a backside helium pressure of less than 3 Torr. After the first deposition process was performed, the PEC was transferred out and the first wafer was transferred into the chamber. The second deposition process was then performed on the first wafer, and the rest of the batch of wafers was then processed.

The third method involved using disclosed embodiments using a PEC that was previously exposed to numerous deposition operations. In this method, the previously used and cleaned PEC was placed on the ESC while the chamber was exposed to conditioning chemistry to pre-coat the chamber with a conditioning layer. The PEC was transferred out of the chamber and back into the chamber to simulate the transferring in of a wafer. The first deposition process was performed on the PEC, while the PEC was electrostatically clamped to the pedestal and helium was flowed as a backside gas to the PEC to maintain its temperature. The deposition process was performed to maintain the PEC at a temperature less than 410° C., with a backside helium pressure of less than 3 Torr. After the first deposition process was performed, the PEC was transferred out and the first wafer was transferred into the chamber. The second deposition process was then performed on the first wafer, and the rest of the batch of wafers was then processed.

Figure 4:
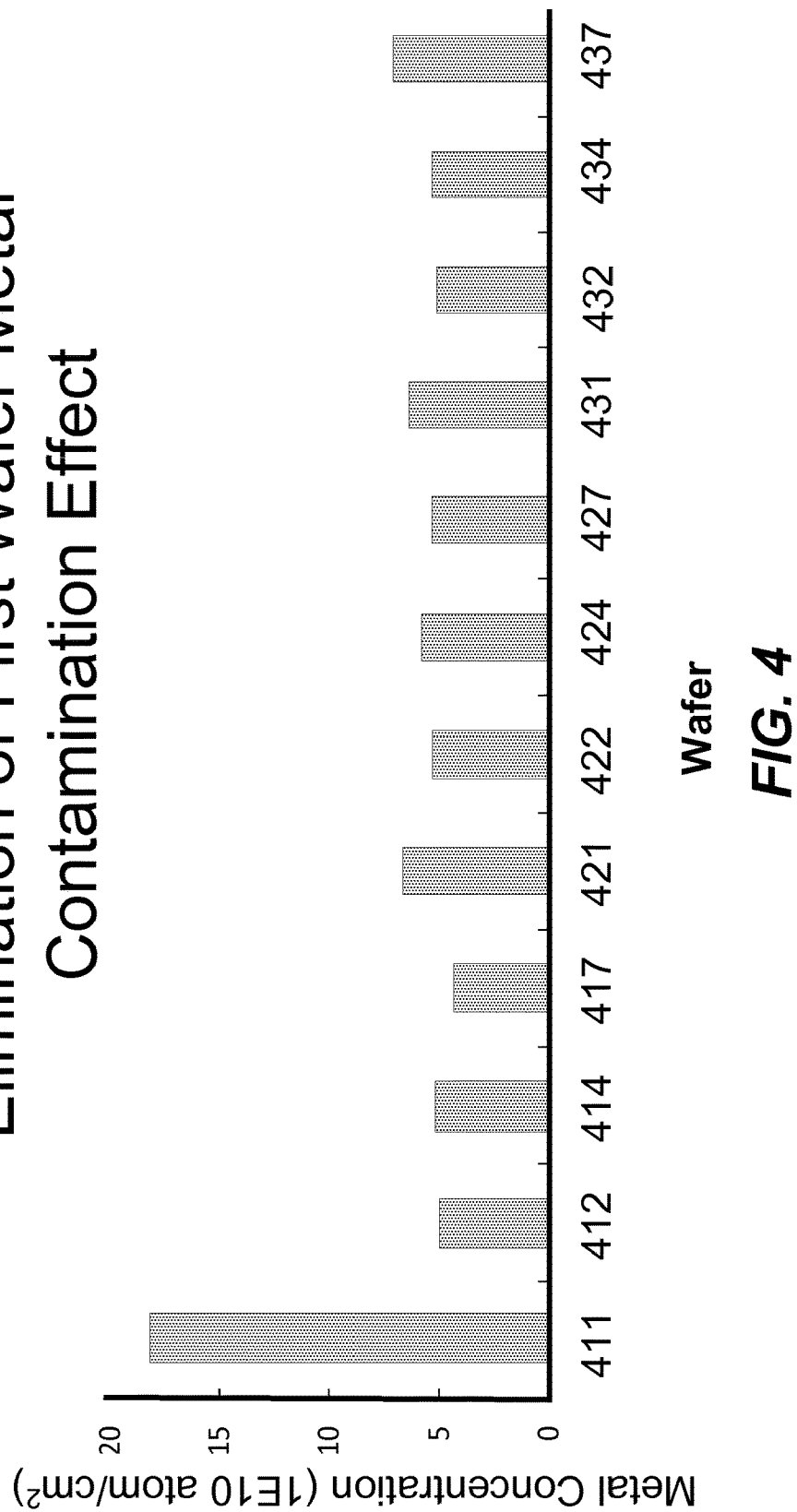
FIG. 4 is a bar graph of results obtained from experiments conducted in accordance with disclosed embodiments.

The metal contamination for a variety of metals was determined for the first, second, fourth, and seventh wafer in each of these methods. The results are plotted in FIG. 4. The first wafer deposited by the first method is represented by 411, the second wafer deposited by the first method is represented by 412, the fourth wafer deposited by the first method is represented by 414, and the seventh wafer deposited by the first method is represented by 417. The first wafer deposited by the second method is represented by 421, the second wafer deposited by the second method is represented by 422, the fourth wafer deposited by the second method is represented by 424, and the seventh wafer deposited by the second method is represented by 427. The first wafer deposited by the third method is represented by 431, the second wafer deposited by the third method is represented by 432, the fourth wafer deposited by the third method is represented by 434, and the seventh wafer deposited by the third method is represented by 437.

As shown, the first wafer from the standard method 411 exhibited greater metal contamination than subsequently processed wafers 412, 414, and 417. The first wafer for the second and third method (421, 431, respectively), however, exhibited metal contamination similar to that of the second wafer in the first method 412, such that the first wafer metal contamination effect is mitigated and possibly eliminated, because the second, fourth, and seventh wafers evaluated for both the second and third methods (422, 424, 427 and 432, 434, 437 respectively) exhibited low metal contamination similar to that of the first wafer for each of these respective methods (421, 431). Such results suggest that disclosed embodiments reduce metal contamination on the first wafer and reduce the first wafer metal contamination effect.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   (a) performing a first stage comprising exposing a chamber to plasma to deposit a film on surfaces of the chamber while no wafer is present in the chamber at a first bias power, the first bias power applied to an electrostatic chuck in the chamber; and
   (b) after performing the first stage, performing a second stage comprising exposing the chamber to plasma to deposit a second film on surfaces of the chamber while no wafer is present in the chamber at a second bias power,
   wherein the second bias power is greater than the first bias power.

2. The method of claim 1, wherein (b) further comprises clamping a protective cover to the electrostatic chuck and flowing a gas to a backside of the protective cover.

3. The method of claim 1, wherein (b) further comprises cooling a protective cover on the electrostatic chuck.

4. The method of claim 1, wherein (b) further comprises performing high density plasma chemical vapor deposition.

5. The method of claim 2, wherein pressure of the gas flowed to the backside of the protective cover is less than about 3 Torr.

6. The method of claim 2, wherein the protective cover comprises ceramic material.

7. The method of claim 2, wherein the protective cover is clamped for at least about 10 seconds.

8. The method of claim 2, wherein the protective cover is clamped at a clamping voltage of at least about 2000V.

9. The method of claim 1, wherein the first bias power is less than about 1500 W.

10. The method of claim 1, wherein the second bias power is at least about 2000 W.

11. The method of claim 1, further comprising (c) after performing the second stage, exposing a wafer to plasma in the chamber to deposit a film by high density plasma chemical vapor deposition.

* * * * *